United States Patent [19]

Jedwab et al.

[11] Patent Number: 5,612,694
[45] Date of Patent: Mar. 18, 1997

[54] ENCODING DATA

[75] Inventors: Jonathan Jedwab, Clifton; Simon E. Crouch, Chippenham; David G. Cunningham, Wickwar, all of England

[73] Assignee: Hewlett-Packard Company, Palo Alto, Calif.

[21] Appl. No.: 397,104
[22] PCT Filed: Jul. 7, 1994
[86] PCT No.: PCT/GB94/01478
§ 371 Date: Mar. 6, 1995
§ 102(e) Date: Mar. 6, 1995
[87] PCT Pub. No.: WO95/02283
PCT Pub. Date: Jan. 19, 1995

[30] Foreign Application Priority Data

Jul. 9, 1993 [GB] United Kingdom ........... 9314480

[51] Int. Cl.$^6$ ............................ G06F 11/00; H03N 13/00
[52] U.S. Cl. ................................ 341/94; 341/58
[58] Field of Search ........................ 341/94, 95, 58, 341/106

[56] References Cited

U.S. PATENT DOCUMENTS

| 5,119,402 | 6/1992 | Ginzburg et al. ........... 375/17 |
| 5,144,304 | 9/1992 | McMahon et al. .......... 341/58 |
| 5,365,231 | 11/1994 | Niimura ...................... 341/58 |

FOREIGN PATENT DOCUMENTS

| 0596736A1 | 5/1994 | European Pat. Off. . |
| 3526051A1 | 1/1987 | Germany . |
| 3526052A1 | 2/1987 | Germany . |
| 57-171859 | 10/1982 | Japan . |
| 62-262537 | 11/1987 | Japan . |
| 2066629 | 11/1979 | United Kingdom . |
| 2191662 | 5/1986 | United Kingdom . |

OTHER PUBLICATIONS

"5B6B Optical Fibre Line Code Bearing Auxiliary Signals", Electronics Letters (1988) 3rd Mar., No. 5, vol. 24.

"New 7B8B Code For Optical Transmission" by W. Slominski et al., 6th Mediterranean Electrotechnical Conf., 22-24 May 1991, Preceedings vol. 1.

"Line Code Conversion for High Speed Optical Transmission Systems—Some Comparisons", G. Bi et al., Int. J. Electronics, 1989, vol. 67, No. 3, 365–376.

"A New Class of Balanced Line Codes for Optical Fibre Transmission Systems", W. Krzymien, IEEE Pacific Rim Conference on Communications, Computers and Signal Processing, Jun. 4–5, 1987.

International Search Report for PCT/GB 94/01478.

*Primary Examiner*—Jeffrey A. Gaffin
*Assistant Examiner*—Peguy Jeanpierre

[57] ABSTRACT

A method of coding, and a coder, using a code in which data words are assigned to code word pairs in a selective manner, so that the value of a data word error resulting from inversion of a bit in a code word may be specific to and dependent solely upon the position within the code word of the inverted bit.

8 Claims, 5 Drawing Sheets

Fig. 3

| Data word | Code words | | Error patterns |
|---|---|---|---|
| 5B/6B | | | |
| 00000 | 000000 | 111111 | S5 = a = 00001 |
| 00001 | 100000 | 011111 | S4 = b = 00101 |
| 00010 | 111110 | 000001 | S3 = c = 10100 |
| 00011 | 011110 | 100001 | S2 = d = 11000 |
| 00100 | 110000 | 001111 | S1 = e = 01010 |
| 00101 | 010000 | 101111 | S0 = a⊕b⊕c⊕d⊕e |
| 00110 | 001110 | 110001* | M1 = a |
| 00111 | 101110 | 010001 | M2 = <a,b> |
|  |  |  | M3 = <a,b,c> |
| 01000 | 111100 | 000011 | M4 = <a,b,c,d> |
| 01001 | 011100 | 100011* | L1 = |
| 01010 | 000010 | 111101 |    <a⊕b⊕c⊕d⊕e> |
| 01011 | 100010 | 011101 | L2 = <a⊕b⊕c⊕d,e> |
| 01100 | 001100 | 110011 | L3 = <a⊕b⊕c,d,e> |
| 01101 | 101100 | 010011* | L4 = <a⊕b,c,d,e> |
| 01110 | 110010 | 001101* | M5 = L5 = any |
| 01111 | 010010 | 101101 |  |
| 10000 | 111000 | 000111* |  |
| 10001 | 011000 | 100111 |  |
| 10010 | 000110 | 111001 |  |
| 10011 | 100110 | 011001* |  |
| 10100 | 001000 | 110111 |  |
| 10101 | 101000 | 010111 |  |
| 10110 | 110110 | 001001 |  |
| 10111 | 010110 | 101001* |  |
| 11000 | 000100 | 111011 |  |
| 11001 | 100100 | 011011 |  |
| 11010 | 111010 | 000101 |  |
| 11011 | 011010 | 100101* |  |
| 11100 | 110100 | 001011* |  |
| 11101 | 010100 | 101011 |  |
| 11110 | 001010 | 110101 |  |
| 11111 | 101010 | 010101* |  |

Fig. 4a

| Data word | Code words | | Error patterns |
|---|---|---|---|
| 2B/3B | ab0 | $\overline{ab1}$ | |
| 00 | 000 | 111 | S2 = a |
| a | 100 | 011 | S1 = b |
| b | 010 | 101 | S0 = a⊕b |
| b ⊕ a | 110 | 001 | M1 = a |
| | | | L1 = a⊕b |
| | | | M2 = L2 = any |
| | | | |
| 3B/4B | abc0 | $\overline{abc1}$ | |
| 000 | 0000 | 1111 | S3 = a |
| a | 1000 | 0111 | S2 = b |
| b | 0100 | 1011 | S1 = c |
| b ⊕ a | 1100 | 0011* | S0 = a⊕b⊕c |
| c | 0010 | 1101 | M1 = a |
| c ⊕ a | 1010 | 0101* | M2 = <a,b> |
| c ⊕ b | 0110 | 1001* | L1 = a⊕b⊕c |
| c ⊕ b ⊕ a | 1110 | 0001 | L2 = <a⊕b,c> |
| | | | M3 = L3 = any |
| | | | |
| 4B/5B | abcd0 | $\overline{abcd1}$ | |
| 0000 | 00000 | 11111 | S4 = a |
| a | 10000 | 01111 | S3 = b |
| b | 01000 | 10111 | S2 = c |
| b ⊕ a | 11000 | 00111 | S1 = d |
| c | 00100 | 11011 | S0 = a⊕b⊕c⊕d |
| c ⊕ a | 10100 | 01011 | M1 = a |
| c ⊕ b | 01100 | 10011 | M2 = <a,b> |
| c ⊕ b ⊕ a | 11100 | 00011 | M3 = <a,b,c> |
| d | 00010 | 11101 | L1 = a⊕b⊕c⊕d |
| d ⊕ a | 10010 | 01101 | L2 = <a⊕b⊕c,d> |
| d ⊕ b | 01010 | 10101 | L3 = <a⊕b,c,d> |
| d ⊕ b ⊕ a | 11010 | 00101 | M4 = L4 = any |
| d ⊕ c | 00110 | 11001 | |
| d ⊕ c ⊕ a | 10110 | 01001 | |
| d ⊕ c ⊕ b | 01110 | 10001 | |
| d ⊕ c ⊕ b ⊕ a | 11110 | 00001 | |

Fig. 4b

| Data word | Code words | | Error patterns |
|---|---|---|---|
| 5B/6B | abcde0 | abcde1 | |
| 00000 | 000000 | 111111 | S5 = a |
| a | 100000 | 011111 | S4 = b |
| b | 010000 | 101111 | S3 = c |
| b ⊕ a | 110000 | 001111 | S2 = d |
| c | 001000 | 110111 | S1 = e |
| c ⊕ a | 101000 | 010111 | S0 = a⊕b⊕c⊕d⊕e |
| c ⊕ b | 011000 | 100111 | M1 = a |
| c ⊕ b ⊕ a | 111000 | 000111* | M2 = <a,b> |
| d | 000100 | 111011 | M3 = <a,b,c> |
| d ⊕ a | 100100 | 011011 | M4 = <a,b,c,d> |
| d ⊕ b | 010100 | 101011 | L1 = |
| d ⊕ b ⊕ a | 110100 | 001011* |    <a⊕b⊕c⊕d⊕e> |
| d ⊕ c | 001100 | 110011 | L2 = <a⊕b⊕c⊕d,e> |
| d ⊕ c ⊕ a | 101100 | 010011* | L3 = <a⊕b⊕c,d,e> |
| d ⊕ c ⊕ b | 011100 | 100011* | L4 = <a⊕b,c,d,e> |
| d ⊕ c ⊕ b ⊕ a | 111100 | 000011 | M5 = L5 = any |
| e | 000010 | 111101 | |
| e ⊕ a | 100010 | 011101 | |
| e ⊕ b | 010010 | 101101 | |
| e ⊕ b ⊕ a | 110010 | 001101* | |
| e ⊕ c | 001010 | 110101 | |
| e ⊕ c ⊕ a | 101010 | 010101* | |
| e ⊕ c ⊕ b | 011010 | 100101* | |
| e ⊕ c ⊕ b ⊕ a | 111010 | 000101 | |
| e ⊕ d | 000110 | 111001 | |
| e ⊕ d ⊕ a | 100110 | 011001* | |
| e ⊕ d ⊕ b | 010110 | 101001* | |
| e ⊕ d ⊕ b ⊕ a | 110110 | 001001 | |
| e ⊕ d ⊕ c | 001110 | 110001* | |
| e ⊕ d ⊕ c ⊕ a | 101110 | 010001 | |
| e ⊕ d ⊕ c ⊕ b | 011110 | 100001 | |
| e ⊕ d ⊕ c ⊕ b ⊕ a | 111110 | 000001 | |

ENCODING DATA

TECHNICAL FIELD

This invention relates to methods and coders for encoding data.

BACKGROUND ART

The spread of personal computers and workstations has led to the development of networks for interconnecting such equipment and common resources such as printers and data storage devices. More powerful and sophisticated computing equipment and programs have progressively become available, allowing the processing of data in larger and larger quantities, for example in the form of database information and graphic images. These developments have in turn placed increasing demands on the speed and capacity of networks.

Various new networking technologies have been proposed to cater for these demands. One such technology is the fibre distributed data interface (FDDI), which is based on the use of optical fibres and optical signals. However, practical experience has shown that although this technology can provide the required performance, it is relatively expensive, requiring the costly process of installing complete new networks of optical fibre, which is itself inherently expensive.

Accordingly attention has also been directed to the possibility of transferring data at high speed over existing wiring installations, thereby avoiding the cost of installing a new network and gaining additional return for the expense previously incurred in installing the existing wiring.

One possible technique along these lines involves the use of unshielded twisted-pair (UTP) telephone cables of the kind already used for lower-speed local-area networks. In this technique, described for example in U.S. Pat. No. 5,119,402, the required high data rate is achieved by transferring the data over multiple conductors, so that different portions of the data are transmitted simultaneously over respective conductors.

Although this technique provides many advantages, it also suffers from potential specific problems. In particular, a primary source of noise affecting such transmissions is electrical impulses, which can affect all conductors together for an extended period relative to the duration of transmission of a data bit. Thus, for example, twenty successive bits of the data to be transmitted may be split into four blocks of five bits each, and encoded by selecting six-bit code values in accordance with the five-bit values from a predefined 5B/6B code table. The four encoded blocks are then transmitted as a group simultaneously along respective ones of four conductors in a multi-conductor cable. It is possible for two successive groups of four blocks each to be affected by electrical noise. Since one group of blocks represents twenty bits, a total of forty bits may be corrupted. Although the data may be protected against some corruption by the use, for example, of a cyclic redundancy check (CRC) code, such codes are typically based on polynomials of degree thirty-two at most to limit the associated processing burden. Such a CRC code can be guaranteed to detect the corruption of at most thirty-two consecutive bits in the data stream, so corruption of forty successive bits can lead to errors which the CRC code does not detect.

It is possible to improve the resistance of such a communication technique to noise-induced errors by selection of particular data word/code word combinations. However, the identification of such combinations has up to now been a difficult and time-consuming procedure.

It is an object of this invention to provide a method and coder for encoding data, for example for communication using cables with multiple conductors, which at least alleviates these problems.

DISCLOSURE OF INVENTION

According to one aspect of this invention there is provided a method of encoding n-bit data words as (n+1)-bit code words, wherein code words are selected in accordance with the values of the data words and a code having the property that the value of a data word error resulting from inversion of a bit in a code word is specific to and dependent solely upon the position within the code word of the inverted bit.

We have found that the use of a code having the property specified above facilitates the choice of correspondence between data words and code words such that the incidence of undetectable errors is reduced or eliminated.

In particular, the code may be selected from the group comprising:

(a) any code in which each data word is definable in terms of one or more of n independent n-bit parameters, and each code word satisfies the condition that each of n of its bits has a value dependent upon whether a respective one of said parameters is included in the definition of the data word associated with that code word; and (b) any invariance transformation thereof (as defined hereinbelow).

According to another aspect of this invention there is provided a coder for encoding n-bit data words as (n+1)-bit code words, comprising means for receiving data words and for selecting code words in accordance with the values of the data words and a code having the property that the value of a data word error resulting from inversion of a bit in a code word is specific to and dependent solely upon the position within the code word of the inverted bit.

BRIEF DESCRIPTION OF DRAWINGS

A method and coder in accordance with this invention for encoding data for communication along four-conductor unshielded twisted-pair cable will now be described, by way of example, with reference to the accompanying drawings, in which:

FIG. 3 is a table of five-bit data values and corresponding six-bit code values;

FIGS. 4a and 4b are tables of data values and corresponding code values for several nB/(n+1)B codes having advantageous properties.

BEST MODE FOR CARRYING OUT THE INVENTION, & INDUSTRIAL APPLICABILITY

The present invention may be used in circumstances where a stream of data is communicated over a plurality of channels, successive portions of the data stream being communicated simultaneously over different respective channels in order to obtain a higher bandwidth than would be possible if all the data were transmitted over a single such channel. For convenience the invention will be described in the context of transmission of binary data over a cable having four channels or conductors (e.g. four pairs of twisted wires). In practice the cable would, for example, form part of a network connecting many stations or nodes, such as personal computers, workstations, multi-user computers, printers or data storage units. Circuit devices associated with these stations would provide the necessary functions for assembling data and network operating information into frames or packets for transmission, for controlling access to the network and for transmitting and receiving physical signals on the cable (for example by differential signalling in the case of twisted-pair conductors). The present invention is independent of the particular details of these functions and may for example be implemented in conjunction with existing network technologies; since such technologies already incorporate known techniques for providing these functions, and the functions form no part of the present invention, they will not be described here.

Figure 1:
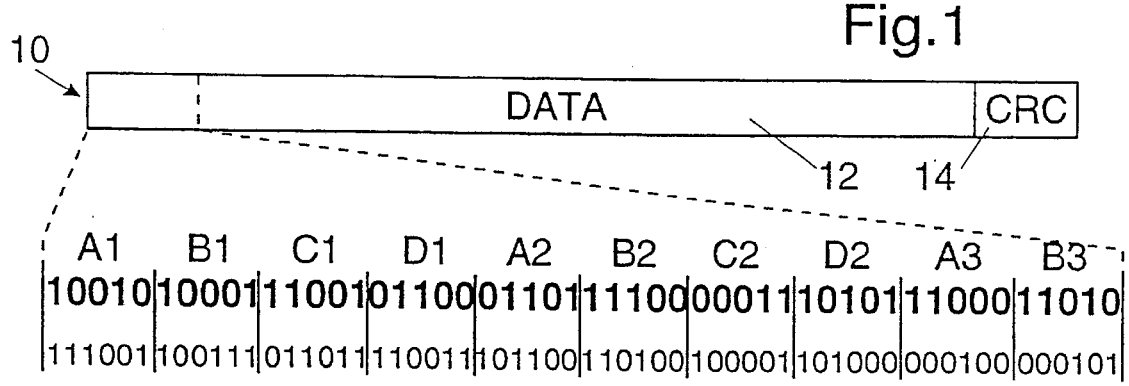
FIG. 1 shows the manner in which data is formatted for communication over the cable.
Figure 2:
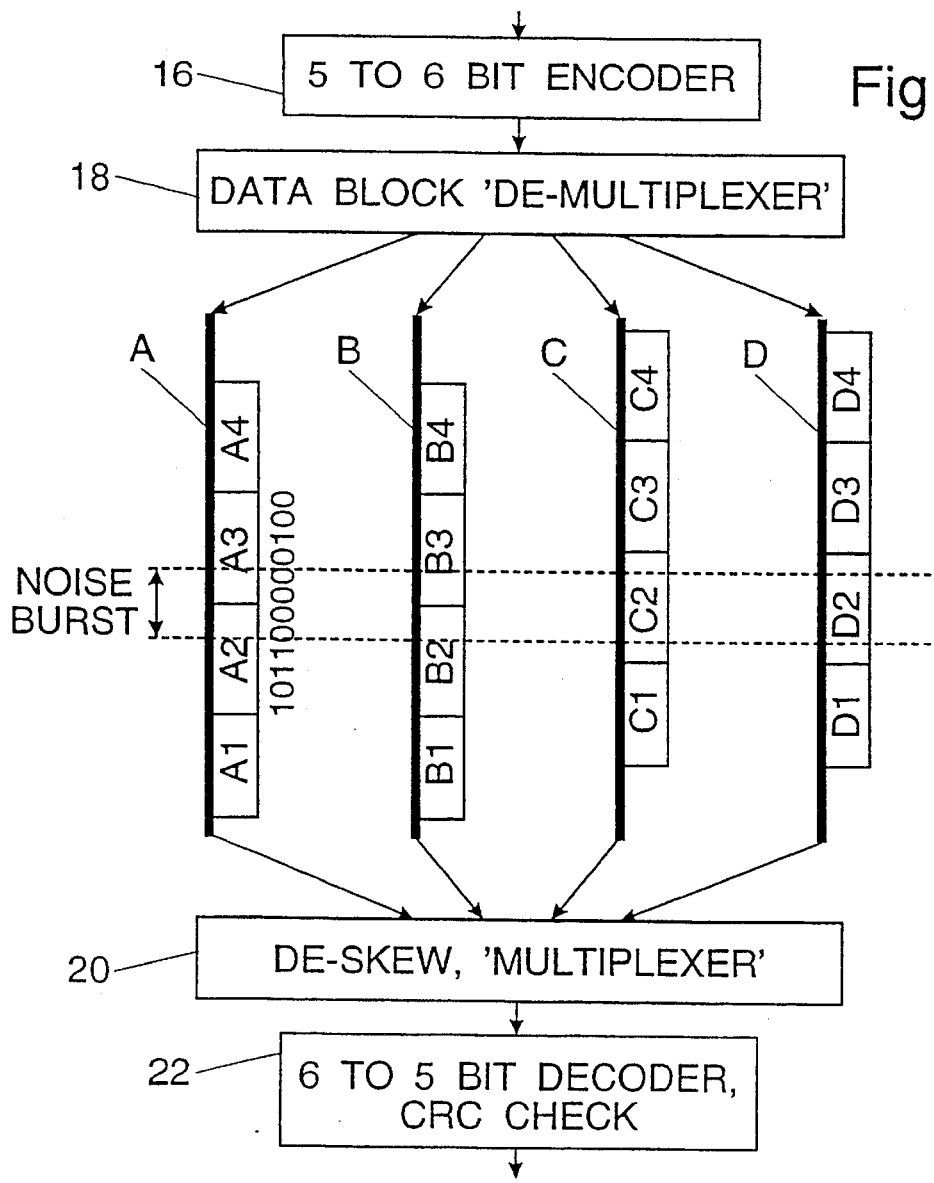
FIG. 2 shows the manner in which encoded data is communicated over the cable.

Referring to FIGS. 1 and 2, a data frame intended to be communicated over a four-conductor cable is shown schematically at 10. This frame comprises: a binary digital message 12 to be transferred, starting with the leftmost bit as shown in FIG. 1, between stations on the network; and an associated thirty-two bit CRC block 14 containing check data derived from the message 12 in known manner in accordance with a predetermined cyclic redundancy check (CRC) algorithm. In the present example it is assumed that the CRC value is derived from the message using a polynomial of degree thirty-two, such as $$g(x)=x^{32}+x^{26}+x^{23}+x^{22}+x^{16}+x^{12}+x^{11}+x^{10}+x^8+x^7+x^5+x^4+x^2+x+1.$$

For transmission over the four-conductor cable the data frame is split into consecutive blocks of five bits each, and the blocks are distributed among the four conductors (herein labelled A to D) on a cyclic basis and starting with the block containing the leftmost bit of the data frame. Thus the first block, labelled A1 in FIG. 1, is transmitted via conductor A, the next block (B1) via conductor B, the third block (C1) via conductor C and the fourth (D1) via conductor D. The cycle then repeats, with conductor A being used again, for the fifth block (A2), and so on.

Prior to transmission the five-bit data blocks are encoded by a 5-to-6 bit (or 5B/6B) encoder 16 (FIG. 2) into six-bit values according to a substitution table, to provide a measure of inherent error detection. The 5B/6B encoding substitutions may be as shown in FIG. 3. These particular 5B/6B substitutions are selected in part to maintain d.c. balance on each conductor, by ensuring that after transmission of each coded data block the accumulated totals of binary ones and zeroes differ by no more than a small, predetermined number.

The encoding is implemented by maintaining a running count for each conductor of the cumulative imbalance between the totals of binary ones and zeroes transmitted along that conductor. Thus, if a code word such as 111100 (having two more binary ones that binary zeroes) is selected, the cumulative imbalance is changed by +2; if the code word is 000001, the cumulative imbalance is changed by −4 (as there are four fewer ones than zeroes); if the code word has equal numbers of binary ones and zeroes (e.g. 010110), the cumulative imbalance is unchanged.

As can be seen in FIG. 3, each possible five-bit data block is assigned two possible six-bit code values, one of which is the inverse of the other. For each data block to be encoded, a choice is made from the two possible encodings according to the following rules:

(i) if the cumulative imbalance is zero and the possible encodings are unbalanced, select (arbitrarily) the encoding which will increase the cumulative imbalance (i.e. the code with more binary ones);

(ii) if the cumulative imbalance is non-zero and the possible encodings are unbalanced, select the encoding which has an imbalance opposite in sign to that of the cumulative imbalance;

(iii) if the possible encodings are balanced, select either encoding. In the case of these balanced code words (indicated in FIG. 3 by a *) it is not strictly necessary to choose between the alternative code words, and one or other may be used to encode every occurrence of the relevant data word.

In FIG. 1 illustrative five-bit data blocks are indicated in bold characters, and corresponding six-bit code values are indicated below them in normal weight characters. Rule (i) is illustrated by block A1; rule (ii) is illustrated by blocks C2 and A3.

The particular set of 5B/6B substitutions given in FIG. 3 is illustrative only; different arrangements of five-bit dam values and six-bit code values in this table may be assigned as desired, as described below.

After encoding, the six-bit code values are distributed or 'de-multiplexed' by a de-multiplexer 18 among the four conductors A to D on a cyclic basis as described above. Thus, as shown in FIG. 2, conductor A will carry encoded data blocks A1, A2, A3, etc. in succession (leftmost bit of each first), conductor B will carry encoded data blocks B1, B2, B3, etc., and likewise for conductors C and D.

When the encoded data blocks reach their destination they are detected and compensation is made in a circuit 20 in known manner for the effects of timing drift and other signal degradation to produce four restored digital signals. These digital signals are then 'multiplexed' back together by the circuit 20 to reconstruct the original encoded data stream. This data stream is then fed to a decoding circuit 22 which derives the five-bit data word corresponding to each six-bit encoded block in accordance with the encoding table in FIG. 3. This decoding circuit also maintains a running count for each conductor A to D of the imbalance between the totals of binary ones and binary zeroes in the code words which it receives, and checks that each new code word complies with rules (i) to (iii) above. If this requirement is not satisfied, or if an otherwise invalid six-bit code is encountered, the entire data frame is rejected. Otherwise the decoding circuit 22 assembles the complete data frame and recalculates the CRC value for comparison with the transmitted CRC value.

In order to increase the resistance of the communication system to the perturbing effects of noise, the encoded data blocks may be transmitted on different ones of the four conductors temporally offset from one another, as described in European patent application No. 92 3 10 199.2. In the specific example shown, data blocks are transmitted on conductors A and B coincidentally (or, in terms of overall blocks, in phase with each other), and offset from (or out of phase with) the data blocks transmitted coincidentally with one another on conductors C and D. The offset in this case is equal to half the length of the encoded data blocks. Thus encoded data blocks on conductors C and D commence half-way through the transmission of encoded data blocks on conductors A and B.

With this arrangement it is possible for a burst of noise arbitrarily corrupting four successive code bits on all four conductors simultaneously to straddle two encoded data blocks on each of two of the conductors, as shown in FIG. 2. However, by virtue of the offset timing of the data blocks on the other two conductors, this noise burst can only affect one data block at most on each of the other two conductors. If the noise burst were to occur two code bits later, as it would have to do to affect encoded blocks C3 and D3 at all, it would no longer affect blocks A2 and B2; although two blocks would now be affected on conductors C and D, only one block would be affected on each of A and B. As a result, the maximum number of consecutive data blocks which can be corrupted is limited to six, corresponding to thirty successive bits of the original data frame. Corruption even of this many data bits can be reliably detected by a CRC algorithm using a degree thirty-two polynomial.

The encoding shown in FIG. 3 is derived as explained below in a manner which confers various desirable properties such as ease of selection for enhanced detection of corruption by noise, and utility for a d.c. balanced system.

nB/(n+1)B encodings for values of n from 2 to 5 and having these properties are shown in FIGS. 4a and 4b (the encoding of FIG. 3 being one example of the general 5B/6B encoding shown in). In FIGS. 4a and the centre pair of columns for each code lists the mutually-inverse pairs of code words. Alongside each (n+1)-bit code word pair the associated n-bit data word is indicated in terms of one or more parameters a, b, c, d and e, since several different assignments of data words to code word pairs are possible. The total number of parameters for an encoding for n-bit data words is n, and each such parameter is itself n bits long. The parameters may each be assigned any value, provided that all the parameter values for an encoding are linearly independent; thus in the case of a 5B/6B code with five parameters, the expression $$Va \oplus Wb \oplus Xc \oplus Yd \oplus Ze = 0$$

(where $\oplus$ signifies a bit-wise exclusive-OR operation) must have only one solution, in which the binary coefficients V, W, X, Y and Z are all equal to zero. For a 4B/5B code (n=4), the parameters may be, for example, a=0001, b=0010, c=0100 and d=1000; for a 5B/6B code (n=5) they may be a=00001, b=00010, c=00100, d=01000 and e=10000. Once the parameter values have been assigned, the data word value corresponding to each code word pair is derived from the parameter expressions in the data word column of FIGS. 4a and 4b, in which $\oplus$ again signifies a bit-wise exclusive-OR operation.

Thus, for example, for a 3B/4B encoding (n=3), the parameter values may be chosen to be a=100, b=010 and c=001, and the data words and corresponding code words will therefore be:

| | | | |
|---|---|---|---|
| 0 | 000 | 0000 | 1111 |
| a | 100 | 1000 | 0111 |
| b | 010 | 0100 | 1011 |
| b $\oplus$ a | 110 | 1100 | 0011 |
| c | 001 | 0010 | 1101 |
| c $\oplus$ a | 101 | 1010 | 0101 |
| c $\oplus$ b | 011 | 0110 | 1001 |
| c $\oplus$ b $\oplus$ a | 111 | 1110 | 0001 |

It can be shown that in the case of any encoding as shown in FIGS. 4a and 4b the effect, in terms of corruption of the data word, of inversion of a single bit of any code word is dependent solely on the position of the bit within the code word and the values of the parameters a, b, etc. (i.e. it is independent of the value of the currupted code word). In particular the effect on any data word will be equivalent to performing a bit-wise exclusive-OR operation between that data word and a constant (referred to herein as the data word error) whose value depends solely on the position of the inverted bit within the code word corresponding to the data word. The value of this constant for each bit position in each code is shown in FIGS. 4a and 4b by the values S0, S1 etc. in the column headed 'Error patterns'. S0 is the data word error induced by inverting the least significant bit of a code word, S1 is the error induced by inverting the next most significant bit, and so on up to Sn which is the error induced by inverting the most significant bit.

Thus, for the 3B/4B code for example, the data word error caused by inverting the least significant bit of a code word is equivalent to an exclusive-OR operation between the data word and the value of the parameter expression $a \oplus b \oplus c$ (see the value S0); for the parameter values given above, this data word error would be 111. Likewise, the error caused by inverting the second most significant bit of a code word is, as shown by the value S2, equivalent to an exclusive-OR operation between the data word and the value of the parameter b; for the above parameter values this data word error S2 would be 010. By way of example, if the code word 1001 (corresponding to the data word 011) is corrupted at the second most significant bit position, it becomes 1101, corresponding to the data word 001, which can be seen to be the result of an exclusive-OR operation between the data word 011 and the data word error 010 (S2).

Furthermore, the effect in terms of corruption of the data word of inversion of multiple bits of any code word is also predictable, and is shown in FIGS. 4a and 4b by the values M1, M2, L1, L2 etc. in the 'Error patterns' column. M1 is the error induced by inverting the single most significant bit of a code word (and is always equal to Sn); L1 is the error induced by inverting the single least significant bit of a code word (and is always equal to S0); M2 is the error induced by inverting one or both of the two most significant bits of a code word; L2 is the error induced by inverting one or both of the two least significant bits of a code word; and so on. Errors induced by inverting two or more bits are shown in FIGS. 4a and 4b in an abbreviated form. Thus, M2 for the 3B/4B code is shown as <a,b>; this represents all possible combinations of a and b, taken alone or exclusive-OR'ed together, that is a, or b, or (a$\oplus$b). With the parameter values given above this indicates that inverting one or both of the two most significant bits of any code word has the effect of an exclusive-OR operation between the corresponding data word and one of only three possible values: 100, 010 or 110. Likewise M3 for the 4B/5B code is shown as <a,b,c>; this represents all possible combinations of a, b and c, taken alone or exclusive-OR'ed together, that is a, or b, or c, or (a$\oplus$b), or (a$\oplus$c), or (b$\oplus$c), or (a$\oplus$b$\oplus$c).

Error patterns Mn and Ln (for cases in which all but the least significant bit or most significant bit respectively of a code word are corrupted) are so severe that they imply any possible corruption of the corresponding data word may occur.

The encodings shown in FIGS. 3 and 4, and similar codings derived as explained below, assign data words to code word pairs in a selective manner, so as to confer advantageous properties on the encoding in addition to properties provided by the use of code words themselves. In particular, the dependence of the effects of code word perturbation on the affected bit position(s) and the values of the parameters a, b, etc. (but on nothing else) enables the consequences of choice of different parameter values to be easily predicted. Accordingly it is relatively straightforward to develop an encoding having specific desired characteristics, such as ensuring that any error induced by a noise burst up to a predetermined length is guaranteed to be detectable using a specific CRC algorithm and polynomial. Likewise it is feasible to develop an encoding which will detect all noise bursts affecting a single bit on all conductors over some specified time period, and/or noise bursts affecting multiple bits in some specific manner.

If it is desired to detect any odd number of single-bit inversions, this may be done by terminating a sequence of code words on a conductor with one of two predetermined delimiters chosen in accordance with the current cumulative imbalance. Thus, in the case of the 5B/6B code of FIG. 3, if the imbalance is +6, +2 or −2, one delimiter would be transmitted. If the imbalance is +4, 0 or −4, the other delimiter is used. Any individual bit inversion produces a change in imbalance of 2, so no odd number of such inversions can produce a total change of 4; therefore any odd number of inversions will result in the receiver expecting the opposite delimiter to that which actually arrives, enabling it to detect the occurrence of the errors.

The encoding shown in FIG. 3 ensures that any error induced by a noise burst up to eight code bits in duration is guaranteed to be detectable using a CRC algorithm with the specific polynomial of degree thirty-two identified above. In addition this encoding, with selection of end delimiters on all four conductors, ensures that any error caused by three separate single-bit noise bursts (i.e. noise bursts each possibly inverting a single bit on one or more of the four conductors) within the duration of 12, 145 bits of the data frame will be detectable.

Another advantage of the encodings shown in FIG. 4 is that they enable a d.c. balanced communication system to be provided even with encodings where the code word length is odd (e.g. 4B/5B). This follows from the rules (i) to (iii) given above for choosing between code words in the pair of code words for each data word.

Encodings with these desirable properties can be derived for any data word/code word length nB/(n+1)B, as will now be explained by reference to the construction of the 5B/6B table in FIGS. 4a and 4b. Referring to FIGS. 4a and 4b, the first step is to prepare a list of data word expressions in terms of the parameters a, b, c, d, e etc. As can be seen this list involves introducing each parameter in turn, combining it in exclusive-OR relationships in all possible distinct ways with the parameters already used.

The two code word columns are divided into (in this case) six individual bit columns; for the left-hand code word column (as shown in the Figure) these bit columns are headed a, b, c, d, e and 0; for the other code word column they are headed NOT a, NOT b, NOT c, NOT d, NOT e and 1 (=NOT 0).

A binary one digit is inserted for each data word in each bit column of the left-hand code word column, if the parameter at the head of that bit column is included in the parameter expression for that data word; otherwise a binary zero digit is inserted. Thus the fourteenth data word in the table has a parameter expression d⊕c⊕a; this includes the parameters a, c and d; accordingly binary one digits are inserted for that data word in the columns headed a, c and d; binary zero digits are inserted in the remaining columns b and e. The least significant bit column is filled with binary zeroes, as indicated at the head of that column.

A similar operation is performed for the other code word column, but in an inverse sense, so a binary one digit is inserted for each data word in each bit column of the other code word column, if the parameter at the head of that bit column is excluded from the parameter expression for that data word. Thus, for the fourteenth data word in the table, binary one digits are inserted in the columns NOT b and NOT e; binary zero digits are inserted in the columns headed NOT a, NOT c and NOT d. The least significant bit column is filled with binary ones, as indicated at the head of that column.

This relationship between values of code word bits and parameter expressions for data words facilitates implementation of such an encoding in hardware, since each bit can be expressed as a logical combination based on the parameter expressions. Accordingly the bit values can be derived using simple combinations of logic gate circuits, avoiding any need for (relatively slower) memory lookup procedures which are commonly used to implement encoding systems.

It can be seen from FIGS. 4a and 4b that in certain circumstances a run of up to fourteen digits (in the case of a 5B/6B code) of the same value can occur in the encoded data, owing to the inclusion of code words with values of 000000 and 111111. If this is considered undesirable, these particular code word values may be replaced by, for example, an unused, balanced code word, at the expense of a slight reduction in ease of derivation of a code having specific desired error detection properties.

Likewise, other changes can be made to the codes described above; thus, the pairs of codes need not be mutually inverse, and pairs of unbalanced codes need not have exactly equal imbalances. Such changes would increase the flexibility of assignment of code words to data words, but again at the cost of reducing the predictability of the specific properties of the code.

Figure 5:
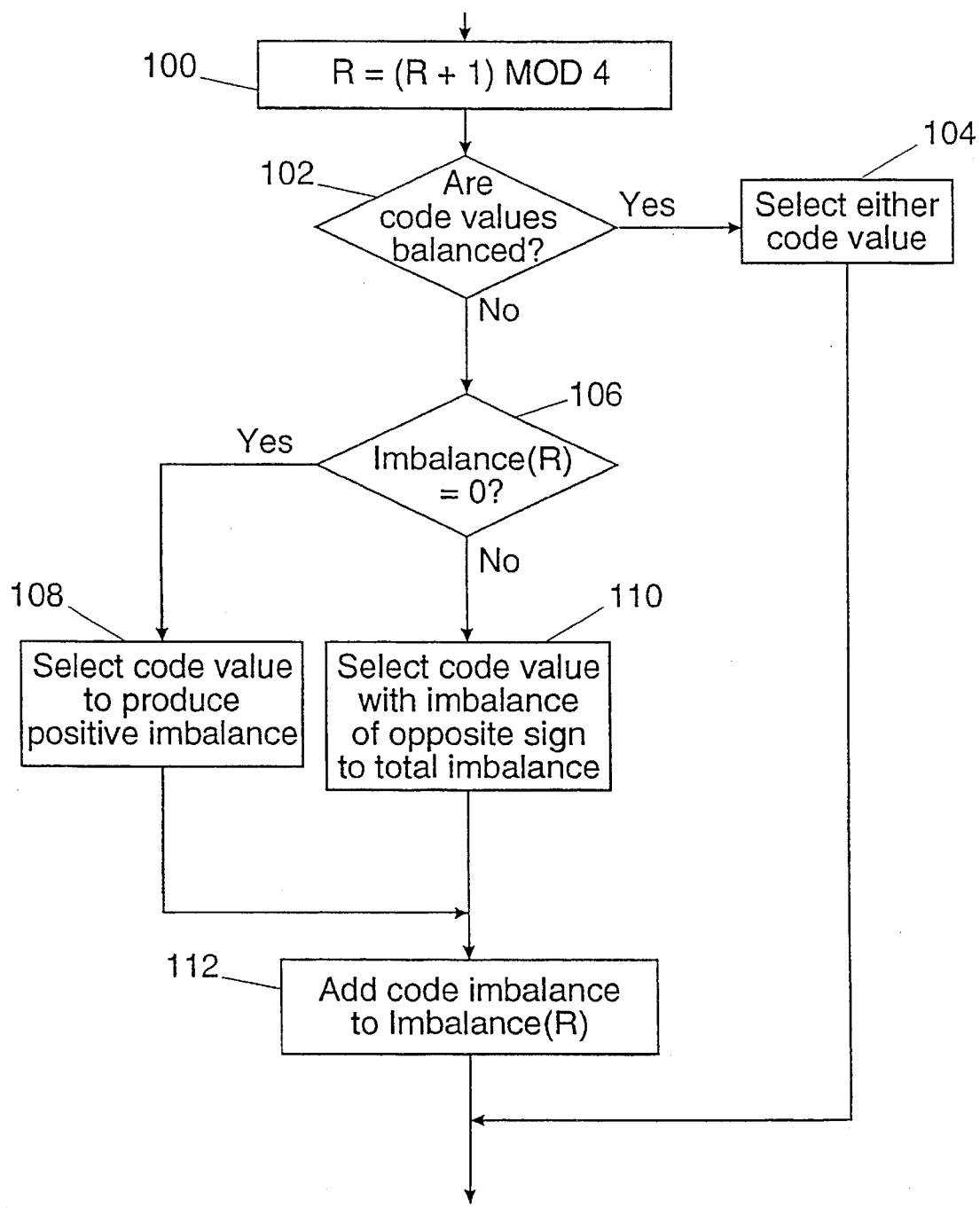
FIG. 5 is a flow diagram of a method for encoding data blocks according to any of the codes in FIG. 4.

FIG. 5 shows a flow diagram of a method for implementing an encoding such as that in FIG. 3. Referring to FIG. 5, at step 100 a counter R is incremented according to the relationship $$R=(R+1) \text{ modulo } 4$$

so that the counter cyclically takes on the values zero to three inclusive. The purpose of this counter is to keep track of the conductor along which the current (encoded) data value will be transmitted. At step 102 the code words corresponding to the present data word are inspected; if they are balanced then either may be selected to encode the data word, at step 104, and the procedure exits. If they are not balanced, the procedure continues to step 106.

As noted earlier, for each conductor a count is maintained of the cumulative imbalance between binary ones and zeroes transmitted along that conductor. At step 106 the cumulative imbalance for the present conductor, selected in accordance with the current value of the counter R, is tested. If the imbalance is zero then at step 108 the procedure selects, from the pair of code words corresponding to the data word, whichever code word will produce a positive cumulative imbalance; if the imbalance is not zero the code value selected, at step 110, is the one which has an imbalance of opposite sign to that of the cumulative imbalance. In either case the procedure then updates the cumulative imbalance for the present conductor at step 112, by adding the imbalance for the selected code word, before exiting.

A broadly similar procedure to that of FIG. 5 may be used by the decoder 22. However, instead of selecting a code value at step 104, the decoder would check that the received code value is valid, and then obtain the corresponding data value. Likewise, at steps 108 and 110, the decoder would check that the received code value is valid and has an imbalance which complies with rules (i) to (iii) stated earlier, and then obtain the required data value. If any of these checks failed, the decoder would determine that an error had occurred during transmission of the data frame.

It will be obvious to a person skilled in the art, given the encodings of FIGS. 3 and 4, that additional encodings having the same properties may be derived therefrom by simple invariance transformations. As an example of such a transformation, the encodings shown herein may be transformed to an equivalent form by an exclusive-OR operation performed with any constant binary value on all the data words; in addition, or alternatively, it is possible to interchange the pair of code words for any data word.

We claim:

1. A method of encoding n-bit data words as (n+1)-bit code words, wherein code words are selected in accordance with the values of non-corrupted data words and a code having the property that the value of a data word error resulting from inversion of a bit in a corrupted code word is specific to and dependent solely upon the position within the corrupted code word of the inverted bit, and further wherein a data word error is a difference between a corrupted data word that is derived from a corrupted code word with at least an inverted bit, and a non-corrupted data word, from which a non-corrupted code word was derived prior to conversion to said corrupted code word.

2. The method according to claim 1, wherein said code is selected from the group comprising:

(a) any code in which each data word is definable in terms of one or more of n independent n-bit parameters, and each code word satisfies the condition that each of n of its bits has a value dependent upon whether a respective one of said parameters is included in the definition of the data word associated with that code word; and (b) any invariance transformation thereof.

3. The method according to claim 1, wherein said code words contain at least four binary digits.

4. A coder for encoding n-bit data words as (n+1)-bit code words, comprising means for receiving data words and for selecting code words in accordance with the values of non-corrupted data words and a code having the property that the value of a data word error resulting from inversion of a bit in a corrupted code word is specific to and dependent solely upon the position within the corrupted code word of the inverted bit, and further wherein a data word error is a difference between a corrupted data word that is derived from a corrupted code word with at least an inverted bit, and a non-corrupted data word, from which a non-corrupted code word was derived prior to conversion to said corrupted code word.

5. The coder according to claim 4, wherein said code is selected from the group comprising:

(a) any code in which each data word is definable in terms of one or more of n independent n-bit parameters, and each code word satisfies the condition that each of n of its bits has a value dependent upon whether a respective one of said parameters is included in the definition of the data word associated with that code word; and (b) any invariance transformation thereof.

6. The coder according to claim 4, wherein said code words contain at least four binary digits.

7. A method of decoding n-bit data words from (n+1)-bit code words, wherein data words are selected in accordance with the values of the code words-and a code having the property that the value of a data word error resulting from inversion of a bit in a corrupted code word is specific to and dependent solely upon the position within the corrupted code word of the inverted bit, and further wherein a data word error is a difference between a corrupted data word that is derived from a corrupted code word with at least an inverted bit, and a non-corrupted data word, from which a non-corrupted code word was derived prior to conversion to said corrupted code word.

8. A decoder for decoding n-bit data words from (n+1)-bit code words, comprising means for receiving code words and for selecting data words in accordance with the values of the code words and a code having the property that the value of a data word error resulting from inversion of a bit in a corrupted code word is specific to and dependent solely upon the position within the corrupted code word of the inverted bit, and further wherein a data word error is a difference between a corrupted data word that is derived from a corrupted code word with at least an inverted bit, and a non-corrupted data word, from which a non-corrupted code word was derived prior to conversion to said corrupted code word.

* * * * *